(12) United States Patent
Telefus et al.

(10) Patent No.: US 11,336,199 B2
(45) Date of Patent: May 17, 2022

(54) LOAD IDENTIFYING AC POWER SUPPLY WITH CONTROL AND METHODS

(71) Applicant: INTELESOL, LLC, Danville, CA (US)

(72) Inventors: Mark Telefus, Orinda, CA (US); Harry Rodriguez, Gilroy, CA (US); Chris Casey, San Francisco, CA (US); Thar Casey, Danville, CA (US)

(*) Notice: Subject to any disclaimer, the term of this patent is extended or adjusted under 35 U.S.C. 154(b) by 19 days.

(21) Appl. No.: 16/809,738

(22) Filed: Mar. 5, 2020

(65) Prior Publication Data
US 2020/0328694 A1    Oct. 15, 2020

Related U.S. Application Data

(63) Continuation of application No. 16/340,474, filed on Apr. 9, 2019, now Pat. No. 11,114,947.

(51) Int. Cl.
| | |
|---|---|
| *G01R 19/25* | (2006.01) |
| *H02J 13/00* | (2006.01) |
| *H02J 3/00* | (2006.01) |
| *H02M 7/217* | (2006.01) |
| *G05F 1/66* | (2006.01) |
| *H02P 27/04* | (2016.01) |
| *H05B 47/10* | (2020.01) |

(52) U.S. Cl.
CPC ........ *H02M 7/217* (2013.01); *G01R 19/2513* (2013.01); *G05F 1/66* (2013.01); *H02J 3/00* (2013.01); *H02J 13/00007* (2020.01); *H02P 27/04* (2013.01); *H05B 47/10* (2020.01)

(58) Field of Classification Search
CPC .......................... G01R 19/2513; H02M 7/217
See application file for complete search history.

(56) References Cited

U.S. PATENT DOCUMENTS

| | | |
|---|---|---|
| 4,074,345 A | 2/1978 | Ackermann |
| 4,127,895 A | 11/1978 | Krueger |
| 4,466,071 A | 8/1984 | Russell, Jr. |
| 4,581,540 A | 4/1986 | Guajardo |
| 4,631,625 A | 12/1986 | Alexander et al. |
| 4,760,293 A | 7/1988 | Hebenstreit |

(Continued)

OTHER PUBLICATIONS

Carvou, E. et al, Electrical Arc Characterization For Ac-Arc Fault Applications, 2009 Proceedings of the 55th IEEE Holm Conference on Electrical Contacts, IEEE Explore Oct. 9, 2009.

(Continued)

*Primary Examiner* — Mark A Connolly
(74) *Attorney, Agent, or Firm* — Mark Wisnosky

(57) ABSTRACT

An improved AC power supply is described. The supply identifies the load through monitoring the current and voltage wave forms and phase relations with the AC Mains. The comparison is done in conditions where the power to the load is programmably varied through use of a control switch located in the line and neutral between the AC mains and the load. The program of controlling the switch is varied to optimize the ability to distinguish similar load types. The switch can be further used to control power to the load that varies according to a set of rules based upon the identity of the load. In a preferred embodiment, the design enables high efficiency with minimal components that may be fully integrated onto silicon.

4 Claims, 11 Drawing Sheets

(56) References Cited

U.S. PATENT DOCUMENTS

| | | | |
|---|---|---|---|
| 4,812,995 A | 3/1989 | Girgis et al. | |
| 5,121,282 A | 6/1992 | White | |
| 5,371,646 A | 12/1994 | Biegelmeier | |
| 5,654,880 A | 8/1997 | Brkovic et al. | |
| 5,796,274 A | 8/1998 | Willis et al. | |
| 5,933,305 A | 8/1999 | Schmaltz et al. | |
| 6,081,123 A | 6/2000 | Kasbarian et al. | |
| 6,111,494 A | 8/2000 | Fischer | |
| 6,141,197 A | 10/2000 | Xu | |
| 6,169,391 B1 | 1/2001 | Lei | |
| 6,188,203 B1 | 2/2001 | Rice et al. | |
| 6,538,906 B1 | 3/2003 | Ke et al. | |
| 6,813,720 B2 | 11/2004 | Leblanc | |
| 6,839,208 B2 | 1/2005 | MacBeth et al. | |
| 6,984,988 B2 | 1/2006 | Yamamoto | |
| 7,053,626 B2 | 5/2006 | Monter et al. | |
| 7,110,225 B1 | 9/2006 | Hick | |
| 7,164,238 B2 | 1/2007 | Kazanov et al. | |
| 7,319,574 B2 | 1/2008 | Engel | |
| 7,586,285 B2 | 9/2009 | Gunji | |
| 7,693,670 B2 | 4/2010 | Durling et al. | |
| 7,729,147 B1 | 6/2010 | Wong et al. | |
| 7,746,677 B2 | 6/2010 | Unkrich | |
| 7,948,719 B2 | 5/2011 | Xu | |
| 8,374,729 B2 | 2/2013 | Chapel et al. | |
| 8,463,453 B2 | 6/2013 | Parsons, Jr. | |
| 8,560,134 B1 | 10/2013 | Lee | |
| 8,717,720 B2 | 5/2014 | Deboer | |
| 8,817,441 B2 | 8/2014 | Callanan | |
| 8,947,838 B2 | 2/2015 | Yamai et al. | |
| 9,287,792 B2 | 3/2016 | Telefus et al. | |
| 9,577,420 B2 | 2/2017 | Ostrovsky et al. | |
| 9,621,053 B1 | 4/2017 | Telefus | |
| 10,931,473 B2* | 2/2021 | telefus | H04L 12/28 |
| 2004/0032756 A1 | 2/2004 | Van Den Bossche | |
| 2008/0180866 A1 | 7/2008 | Wong | |
| 2008/0204950 A1 | 8/2008 | Zhou et al. | |
| 2009/0168273 A1 | 7/2009 | Yu et al. | |
| 2009/0213629 A1 | 8/2009 | Liu et al. | |
| 2010/0091418 A1 | 4/2010 | Xu | |
| 2010/0155369 A1 | 6/2010 | Kularatna et al. | |
| 2010/0191487 A1* | 7/2010 | Rada | G01D 4/004 702/60 |
| 2010/0320840 A1 | 12/2010 | Fridberg | |
| 2011/0156610 A1 | 6/2011 | Ostrovsky et al. | |
| 2011/0292703 A1 | 12/2011 | Cuk | |
| 2011/0301894 A1 | 12/2011 | Sanderford | |
| 2012/0026632 A1 | 2/2012 | Acharya et al. | |
| 2012/0089266 A1 | 4/2012 | Tomimbang et al. | |
| 2012/0323510 A1* | 12/2012 | Bell | H04M 19/08 702/62 |
| 2013/0187631 A1* | 7/2013 | Russell | G01R 19/175 324/76.77 |
| 2014/0085940 A1 | 3/2014 | Lee et al. | |
| 2014/0164294 A1* | 6/2014 | Osann, Jr. | G08B 13/19693 705/412 |
| 2014/0365490 A1* | 12/2014 | Yang | G06F 16/285 707/737 |
| 2015/0185262 A1* | 7/2015 | Song | G01R 21/133 702/64 |
| 2017/0067961 A1* | 3/2017 | O'Flynn | G01R 31/3004 |
| 2019/0280887 A1 | 9/2019 | Telefus et al. | |
| 2020/0044883 A1 | 2/2020 | Telefus et al. | |

OTHER PUBLICATIONS

Yang et al, Series Arc Fault Detection Algorithm Based on Autoregressive Bispectrum Analysis, Algorithms, Aug. 2015, 929-950; doi:10.3390/a8040929.

Restrepo, Arc Fault Detection and Discrimination Methods, Electrical Contacts—2007 Proceedings of the 53rd IEEE Holm Conference on Electrical Contacts, IEEE Explore Sep. 24, 2007.

Eguchi et al, Design of a Charge-Pump Type AC-DC Converter for RF-ID TAGS, 2006 International Symposium on Communications and Information Technologies, F4D—3, IEEE (2006).

Park, Jeong-Eon, et al, Design on Topologies for High Efficiency Two-Stage AC-DC Converter, 2012 IFFF 7th International Power Electronics and Motion Control Conference—ECCE Asia Jun. 2-5, 2012, Harbin, China, p. 257.

Cuk, Slobodan, 98% Efficient Single-Stage AC/DC Converter Topologies, Power Electronics Europe, Issue 4, 2011, www.power-mag.com; p. 16.

Ayari, A et al, Active Power Measurement Comparison Between Analog and Digital Methods, International Conference on Eleclrical Engineering and Software Applications 2013.

Gregory, George D. The Arc-Fault Circuit Interrupter, An Emerging Product, IEEE 1998.

* cited by examiner

LOAD IDENTIFYING AC POWER SUPPLY WITH CONTROL AND METHODS

CROSS-REFERENCE TO RELATED APPLICATIONS

This application is a continuation of U.S. Ser. No. 16/340,474, filed Apr. 9, 2019, currently pending and titled load identifying AC power supply with control and methods, which is a US national application of PCT/US17/46533 filed Aug. 11, 2017, of the same title, that claims priority to U.S. Provisional application 62/414,467, Titled: High Efficiency AC to DC Converter and Methods, Filed Oct. 28, 2016, and, U.S. Provisional Patent Application 62/431,926, Titled: Electronic Switch and Dimmer, Filed Dec. 9, 2016. All applications include a common inventor.

STATEMENT REGARDING FEDERALLY SPONSORED RESEARCH OR DEVELOPMENT

Not Applicable.

BACKGROUND OF THE INVENTION

Technical Field

The invention relates to an AC power supply and methods to identify a connected electronic load and control the AC power to the load based upon the identification of the load.

Related Background Art

The traditional means for providing AC power from an AC mains to a device within a home is through plug in outlets. The outlets typically include no active electronics and are simply a connector. Newer outlets include fault detection circuitry but rarely provide any means to measure or control the AC power delivered to a connected device. Recent approaches to improved electrical power distribution within a home include home area networks that interact with electronic devices that include communication means such as wired and wireless local area networks. Control is often through an application programmed on a personal computer or personal device such as a smart phone or tablet computer. Another approach is through including additional electronics in wall switches. Newer programmable thermostats are used to control central heating and air conditioners. Although these devices provide improved control and feedback of energy use they rely on improved electronics within the devices themselves and do nothing for improvement in the distribution of AC power to older legacy devices that plug into wall outlets. Government agencies such as the U.S. Department of Energy, through programs such as the EnergyStar® (Energy Star is a registered trademark of the U.S. Department of energy) program set standards for new devices and appliances that are recognized as low energy consumption. In many cases the energy consumption is reduced through smart management of the AC power supply to the device through reduced energy use when the device is in an idle or sleep mode. Again the focus is on new devices and appliances and do nothing for the vast installed base of devices. Smart control of the new devices often requires knowledge of the nature of the device. Power drawn by the device is managed through built in sets of rules programmed into microprocessors located within the device that control the AC power. For example, a washing machine might be completely disconnected from the power supply during idle times and await a manual start of the next load. However, a refrigerator cannot be so disconnected as power must be maintained to monitor temperature and start the compressor to maintain a set point. Other devices and appliances such as televisions, computers, displays and printers might have a set of rules that are developed through monitoring usage and time of day. Power to the devices may be significantly reduced at times when it is known through past history of usage that the device is not typically used. In some cases, there are user settings that allow the user to select how quickly the device will enter a sleep mode of low power consumption. Again all of these improvements in energy usage are typically incorporated in the devices themselves. Improvements in the power consumption through external control of the power supply is possible but requires knowledge of the nature of the device. In some cases, general categories of device types, such as lighting, refrigeration, etc. is sufficient to provide a set of rules that will improve performance through decreased power consumption. A first step is to be able to identify the load device. There is a need for a power supply in the form of a smart outlet or a connector between the AC mains and the electrical load device that includes a means to identify the interconnected device so the identification can be used to control the power to the device.

Traditional means to identify the load are not sufficient. Wave form analysis looking for phase shift induced by the load is well known. More exotic systems use wave form analysis including pattern matching of high frequency patterns present on current and voltage waveforms. Although these provide improvements there is still difficulty in distinguishing between similar loads such as two loads that that are primary resistive or two loads that both incorporate an electronic motor. Deep learning methods applied to high frequency components of the wave forms have still been insufficient to fully identify connected electronic loads. There is a need for improved wave form analysis to identify loads connected to AC mains supplies. There is a need for such an AC supply to be able to be fully integrated into any of: an electrical supply panel, an outlet box connected to an electrical supply panel, a power strip, or an extension cord attached to an outlet box. There is a need for a load identification and control system that can be fully integrated on silicon.

SUMMARY OF THE INVENTION

A load identifying AC power supply system is described that includes electronics to identify the load connected to the AC power supply and control power to the load based upon the identification. The load identifying AC power supply may be integrated into existing electrical supply panels, outlet boxes or integrated into connectors such as electrical cords and power strips. In one embodiment, each of the outlets on the cord or power strip includes electronics to identify the attached load and control the power delivered to the load. In one embodiment the invented load identifying AC power supply includes voltage and current sensors and load demand sensors. Real time wave form analysis of the voltage and current supplied to the load and the load demand is completed by a microprocessor. The load identifying AC power supply further includes a programmable switch in series with the load that can be operated at frequencies higher than the frequency of the AC mains and that can both turn power on and off as well as use pulse angle modulation to control the power supplied to the load. The load identifying AC power supply includes the functionality that the AC supply to the load is regulated on the basis of identification of the load. In one embodiment the load identifying AC power supply includes a microprocessor that is programmed to control the switch and to acquire current and voltage wave forms and then recognize particular patterns and relations in the voltage and current waveforms and associate those patterns with particular connected load device or multiple devices. The wave forms are analyzed by either a set of rules that will categorize the nature of the load or through pattern matching techniques. The rule based and pattern matching techniques are enhanced by wave form analysis both with and without variation of power supplied to the load using the programmable switch, thereby increasing the discrimination between different load types. In one embodiment the voltage regulator comprised by a switch placed in series of AC Line or Neutral and is modulated by chopping off segments of the AC Source sinusoid thereby varying the effective voltage on the load by phase angle "chop" or phase angle modulation (PAM). Applying PAM with respect to AC Source the AC voltage across the load will reduce the effective voltage drop proportional to the angle. The current and voltage waveforms of the load are monitored before, during and after the modulation of the supply voltage. In one embodiment a load that includes power management is distinguished from loads that do not include power management by observing the reaction of the power management system, as reflected in the voltage, current and power waveforms, to the reduced supply voltage. In another embodiment a preselected pattern of variation of the power to the load is applied over a limited number of load cycles. In one embodiment neural network analysis is used to analyze and sort waveforms based upon both undisturbed and varied power to the load. In another embodiment the programmed control of the switch is optimized on the basis of the ability to distinguish load types. In another embodiment, where there is a plurality of load types connected on the same circuit, the program to control the switch is optimized to maximize the number of distinguishable connected loads. In one embodiment identification of the devices is limited to a set of general categories of devices. Non-limiting examples of the categories include resistive loads, capacitive loads, inductive loads, and loads of these three types that further include power factor correction devices to maintain constant power with varying supply voltage.

The AC power supply includes a connection to AC mains, an AC/DC converter that provides DC power to a microprocessor, current and voltage sensors and a programmable switch. Voltage sensors utilize resistive dividers and current is sensed with a current-sensing resistor, current amplifier, and Hall Effect sensors. The sampling results are typically processed by comparators, analog to digital converters (ADC), and, stored in data storage elements. In the preferred embodiment the AC/DC converter and the programmable switch both use designs that enable the entire AC power supply to be integrated on silicon.

The specific examples are not intended to limit the inventive concept to the example application. Other aspects and advantages of the invention will be apparent from the accompanying drawings and detailed description.

DETAILED DESCRIPTION OF THE INVENTION

Figure 1:
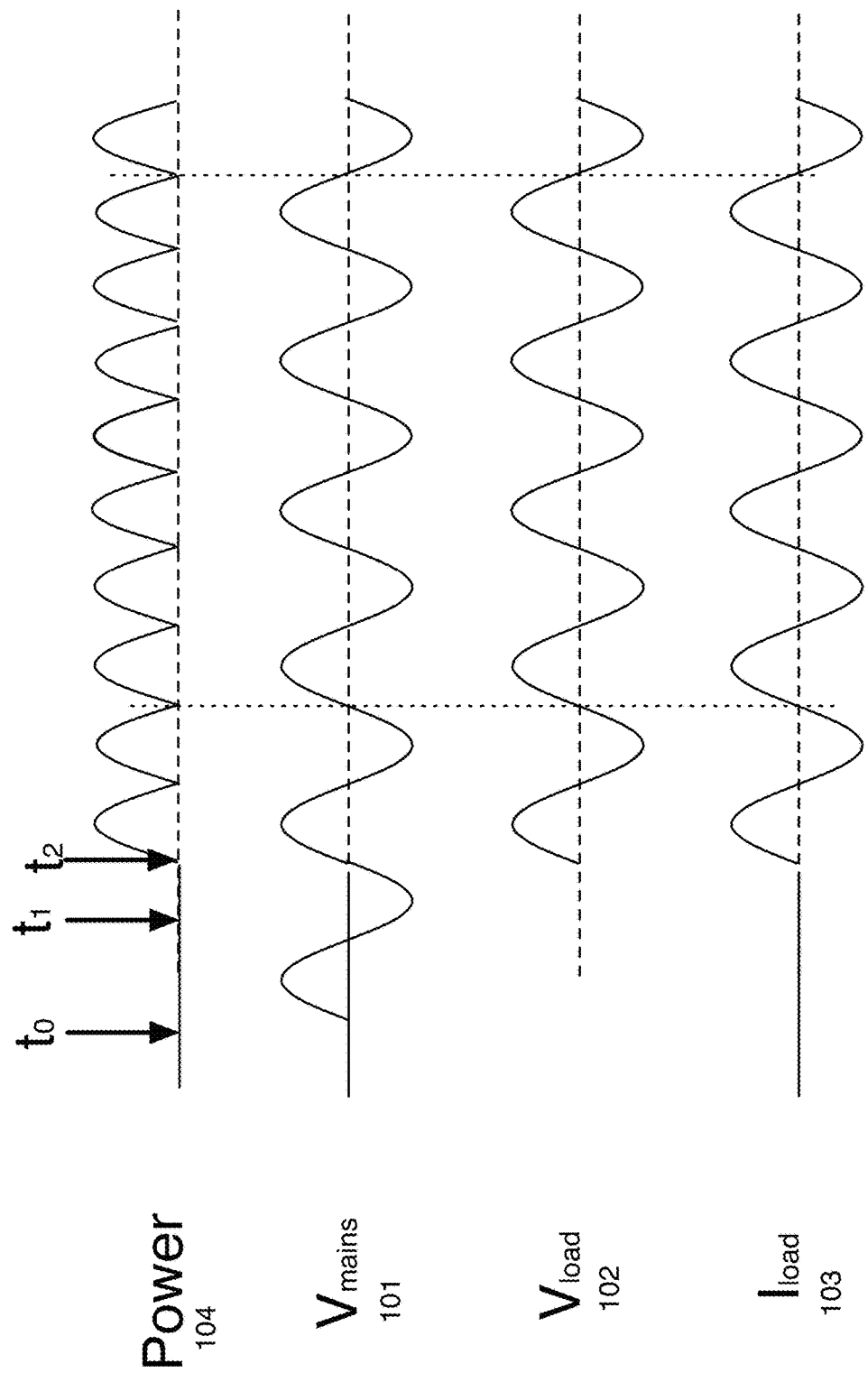
FIG. 1 is a diagram depicting aspects of prior art electronic load identification.
Figure 2:
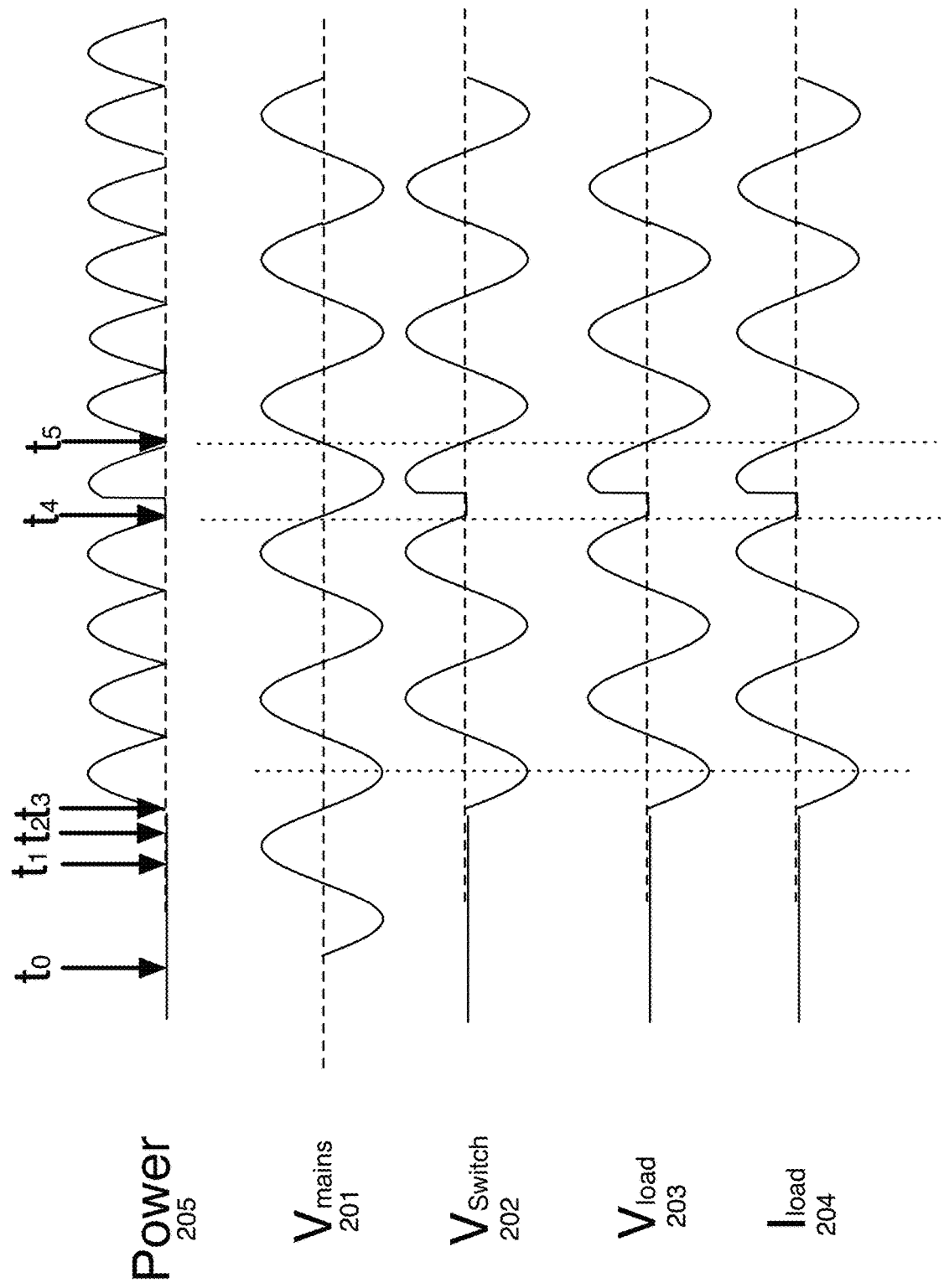
FIG. 2 is a diagram, in the style of FIG. 1, of a first embodiment of the improved electronic load identification.
Figure 3:
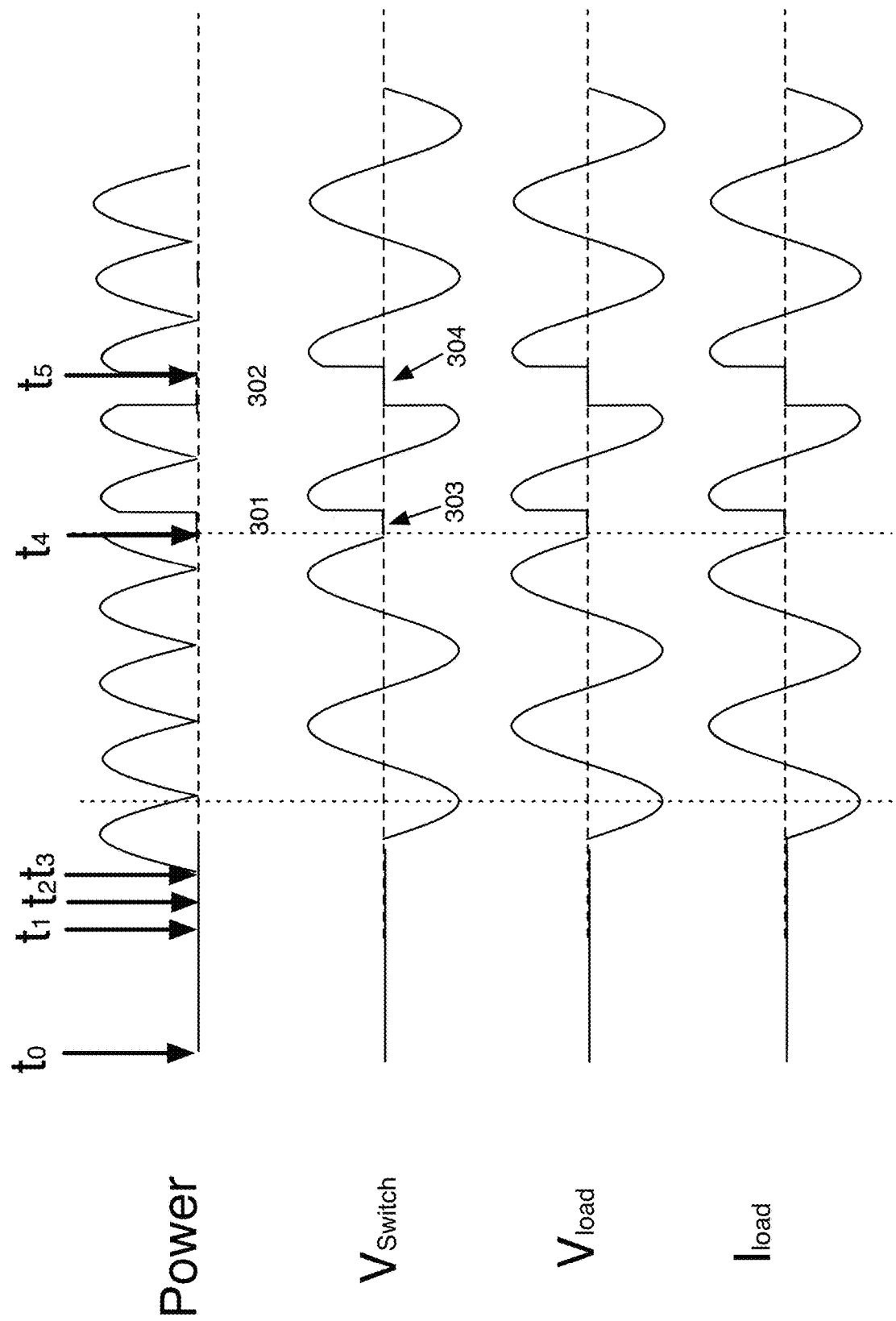
FIG. 3 is a diagram, in the style of FIG. 1, of a second embodiment of the improved electronic load identification.
Figure 4:
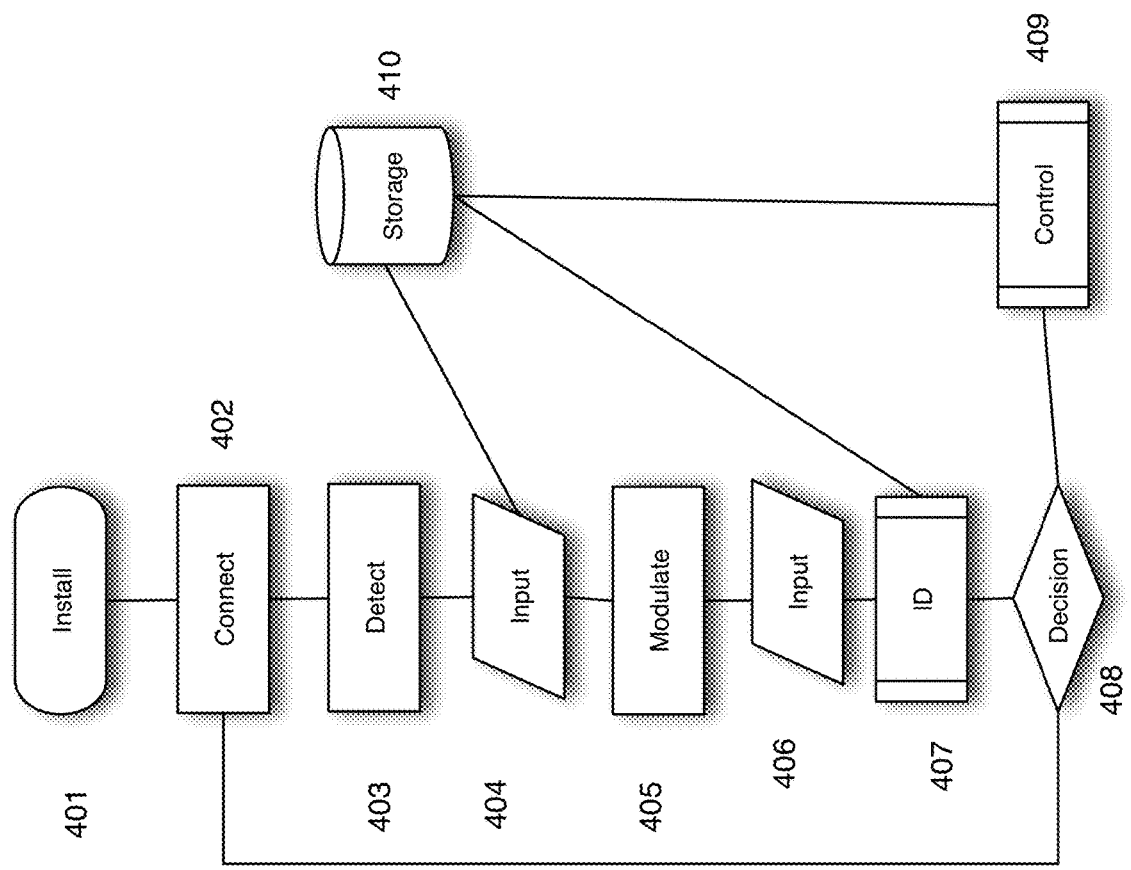
FIG. 4 is a flow chart for the improved method of electronic load identification.

Referring to FIG. 1, typical prior art methodology for identification of the load attached to an AC source is shown. The graphs depict the general wave forms used in a prior art analysis and include the AC mains 101, the voltage 102 and current 103 for the connected load and the power 104 dissipated by the load. The horizontal axis of each graph represents time and the vertical axis represents the value for the indicated measure. In a typical situation an outlet is powered at $t_0$ and a load is connected at $t_1$, power is subsequently drawn by the load at $t_2$. In most situations $t_1$ and $t_2$ are, for the measurement capabilities of prior systems, simultaneous. Prior art systems do not include the capabilities of measuring a time difference between $t_1$ and $t_2$. In simplest forms the prior art systems look for phase shifts between the voltage and current of the load relative to the phases of the mains. In more sophisticated prior art systems patterns of high frequency variations on the on the wave forms $V_{load}$ 102 and $I_{load}$ 103 are matched against known patterns for anticipated loads. Note that the wave patterns shown in the FIG. 1, and subsequent FIGS. 2-4, are symbolic of the type of data obtained and do not depict details such as high frequency variations included in the wave forms. High frequency noise atop a low frequency waveform is well known by those skilled in the art.

Referring to FIG. 2 a first embodiment of the analysis methods included in the invented load identifying AC power supply are shown. The graphs are for values versus time (the horizontal axis) for the voltage of the AC mains 201, the voltage 202 output by a programmable switch place in series between the AC mains and the load. AC mains is powered and on at least at some reference time t0. At time t1 a load is plugged into an outlet or otherwise connected to the load identifying AC power supply. The load identifying AC power supply detects the connected load and the programmable switch is turned on at time t2 thereby connecting AC mains to the load. The load begins drawing power at time t3. By virtue of having a programmable switch in series between the AC mains and the load, the exact time of applying power $t_2$ to the load the and the exact time that the load begins to draw power t3 are known. In this fashion loads that include some form of power regulation resulting in a turn on delay can be distinguished from loads that do not include such controls. That is, in most situations $t_2$ and $t_3$ are very nearly simultaneous. However, delays between $t_2$ and $t_3$ can be indicative of a load type. The load identifying AC power supply monitors voltage 203, current 204 and power 205 drawn by the load for a period of time between t3 and t4. Monitoring implies analysis in the form of acquiring, storing and comparing the waveform data for all of the graphs shown including frequencies at or near the frequency of the AC mains 201 and high frequency patterns (not shown) superimposed upon the wave forms. Analysis includes looking for patterns in both low frequency and high frequency signals as wells as phase shifts between the AC mains and the voltages, current and power waveforms for the load. In one embodiment, at time t4 the programmable switch is activated to vary the power supplied to the load. In the non-limiting example shown the power to the load is reduced for a fraction of a cycle between t4 and t5. During this time period (t4 to t5) and after t5 all of the waveforms are continually acquired and analyzed. The waveforms including high frequency components are again analyzed for identification of the loads. In this instance, however, the additional data of the waveforms before, during and after a programmed change in the applied power is available to enhance the ability to distinguish between load types and particular loads. In another embodiment the switch is used to control applying power to the load to avoid surges such as might occur after restoration of power from a loss of power (black out) or reduction in the supply voltage (brown out). FIG. 3 shows waveform analysis in an additional embodiment of the invention. The graphs are for the same data as depicted in FIG. 2. Time t0 is a reference time or the start of data acquisition. At time t1, a load device is connected to the AC mains circuit including the load identifying AC power supply. The load is detected and a switch in series is activated at time t2, supplying power to the device. The load draws power at time t3. At a later time, t4, the power is varied to the device. In this case the power is reduced to the device over a period of two cycles 301, 302 and the reduction in the second cycle 302 is greater than the reduction in the first reduced cycle 301. The waveforms 301, 302 are indicative of a power supply using phase angle modulation such that the voltage applied to the load is zeroed over a portion of a wave cycle. The wave forms are indicative of having a programmable switch in series with the load in the invented load identifying AC power supply. In a preferred embodiment the variation of the power applied to the load is synchronized with the wave from of the AC mains. In another embodiment the variation of power applied to the load is synchronized with a timing signal received from the load. The variations available by virtue of having a high speed programmable switch in series with the load although not limitless are extensive. Power to the load may be programmably modified over a selected period of time that is less than cycle of a single period of the AC mains. In another embodiment, a pre-selected plurality of series of variations in the applied power are applied to the load. The pre-selected series of variations selected as a set that is known to enable detection of different load types. That is, for example, a first variation may be as shown in FIG. 2 and this is followed by a period of applying full power to the load and then a second variation in the power applied to the load as depicted in FIG. 3.

The wave forms of the AC mains and the voltage and current across and through the load are recorded and analyzed at a sampling frequency that is significantly greater than the cycle time of a single period of the AC mains. The sampling frequency of the voltage and current wave forms are selected as required to distinguish load types. In one embodiment the sampling frequency is at a kilohertz range. In another embodiment the sampling frequency is at a megahertz range. In a preferred embodiment, the programmed variation of the power applied to the load is selected so as to optimize differentiation in the acquired waveforms between anticipated load types. In one embodiment analysis of the waveforms includes matching patterns in the high frequency components of the voltage and current waveforms from the load. In another embodiment analysis of the wave forms includes determining a delay in timing of the load drawing power after power is first applied to the load. In another embodiment analysis means classifying the acquired waveforms, including high frequency components thereof, into groups that are indicative of different load types. Non-limiting examples of groups include waveforms indicative of a primarily resistive load, a capacitive load, an inductive load, loads that includes power factor correction and loads that include power control such that there is a delay in the power to the load at initial application of power form the source.

Referring now to FIG. 4, a method for using the load control AC source is shown. A load control appliance is installed 401. In one embodiment installation includes electrically connecting the load control device between the AC mains supply and the load. In one embodiment this installation includes installing the load control device in the junction box. In another embodiment the installation includes installing the load control AC source in a wall outlet. In another embodiment installation includes installing the load control device as an electronic supply strip or smart extension cord by plugging the load control device into a conventional wall outlet and the load is to be plugged into the load control device. One the load control device is installed 401, a load is attached to the load control device 402. The load control device detects the load 403 and power is supplied to the load by activating the switch within the load control device. The switch and the details of the the load control device are shown in subsequent Figures. Once load is detected, data acquisition 404 is initiated. Data acquisition includes recording timing as to when the load is connected to power, when power is applied to the load and when power is used by the load. Data acquisition further includes acquiring waveform data. Any data acquired once a load is detected that is specific to a load is termed "load data". Load data includes the turn on timing of the load as well as waveform data. Waveform data includes acquiring values of the AC main voltage, the load voltage the load current and the power consumed by the load as a function of time. All are acquired at a frequency optimized for detection of the type of load. In one embodiment data is acquired at a frequency that is a multiple higher than the frequency of the AC mains source. In one embodiment data for a 50 to 60 cycle AC source data is acquired at a kilohertz rate. In another embodiment that relies upon high frequency components of the voltage and current wave forms for identification of the load, data is acquired at a megahertz rate. Acquired load data is stored 409 for analysis. In one embodiment storage includes storage in short term random access memory of a microprocessor for immediate or nearly immediate processing. In another embodiment storage includes storage in long term memory such that the stored load data is used for subsequent pattern matching to identify the identical or similar loads based upon matching of the waveform patterns obtained at first connection of a load 402 (i.e. first pass through the indicated flow chart) with connection of the same or different loads at later times. In one embodiment the storage 409 includes storage that is accessible by a plurality of load control devices. Such storage is accessible by devices that are wired or wirelessly connected to the load control AC source or by transfer of the stored load data from a first load control AC source to a second load control AC source. Once connected 402 and detected 403 and after initial data acquisition 404, the power to the device is modulated 405. Modulation means varying the power to the device using a programmable switch. Further load data is acquired 406 both during and after modulation and the load is then identified 407 on the basis of the load data. In one embodiment identification is on the basis of comparing the wave forms of the load data with previous acquired waveforms in load data of known load devices. In another embodiment the load is identified on the basis of both the timing around the turn on of the power to the load, as already discussed, and matching of the wave form data. In another embodiment a neural network analysis is used to classify the load data into a category of load types by comparison with a library of prior load data. In another embodiment identification of the load means classifying the load into a particular category of load based upon the phase relationship between the load voltage and current wave forms and the AC mains voltage wave form both before, during and after modulation of the power to the load using the series switch. In one embodiment the load is identified 407 as one of:

1. Pure Resistive Load. Voltage and current zero crossing and peak synchronously both before during and after modulation of the supply voltage. Power is reduced when voltage is reduced, power returns to pre-modulation level when modulation of supply voltage is stopped and supply voltage returns to full voltage.
2. Constant power Resistive load with power correction. Voltage and current peak synchronously before modulation, Power is constant before, during and after modulation,
3. Pure Reactive (capacitive or inductive) load. Voltage and current are out of phase before, during and after modulation, Power is reduced during modulation of the supply voltage, Power returns to pre-modulation level when modulation of supply voltage ends and returns to full voltage.
4. Constant Power Reactive load. Voltage and current are out of phase before, during and after modulation, Power is constant before, during and after modulation of the supply voltage.

In one embodiment the modulation of the supply voltage results in a reduction of the RMS supply voltage by an amount an amount between 1 and 20%.

In one embodiment identification 407 further includes determining a confidence level for the identification. In one embodiment the confidence level is determined by the goodness of fit of a match of the load data obtained during the data acquisition steps 404, 406 with data obtained previously on known loads and stored 410. Once the identification step 407 is complete the system further checks 408 whether the load has been identified and whether there are control rules associated with the load identification. In one embodiment the check 408 on identification is done by comparing a confidence level in the identification with a pre-selected confidence level defined as positive identification. If the load is positively identified and there are pre-selected control rules associated with the identified load, then control 409 of the load is implemented. In the preferred embodiment the power to the load is then controlled by the switch in series with the load. Non-limiting examples of pre-selected control rules include:

1. During daylight hours, a pure resistive load such as a light bulb is dimmed to reduce power usage, especially during peak demand.
2. In constant power load when load demands dropped the input power will drop accordingly to minimize the power consumption of no load/minimum load requirements.
3. In remote location (no human presence) the a pure resistive load and a constant power resistive load will be disconnected and reconnected automatically by the demand of the load
4. Devices that produce an arc during normal operation (e.g. an electric motor having brush connections to the rotor) are ignored by an arc fault circuit interrupter to prevent nuisance disconnects.

In another embodiment there are a pre-selected set of rules based upon whether the load is one selected from: a pure resistive, a constant power resistive, a pure reactive and a constant power reactive. In one non-limiting example of pre-selected rules loads identified as having an included power factor correction, that is constant power loads, are not turned off by the controller and a pure resistive loads are turned off during pre-selected periods of time and power to pure reactive loads is reduced during pre-selected periods of time.

Figure 5:
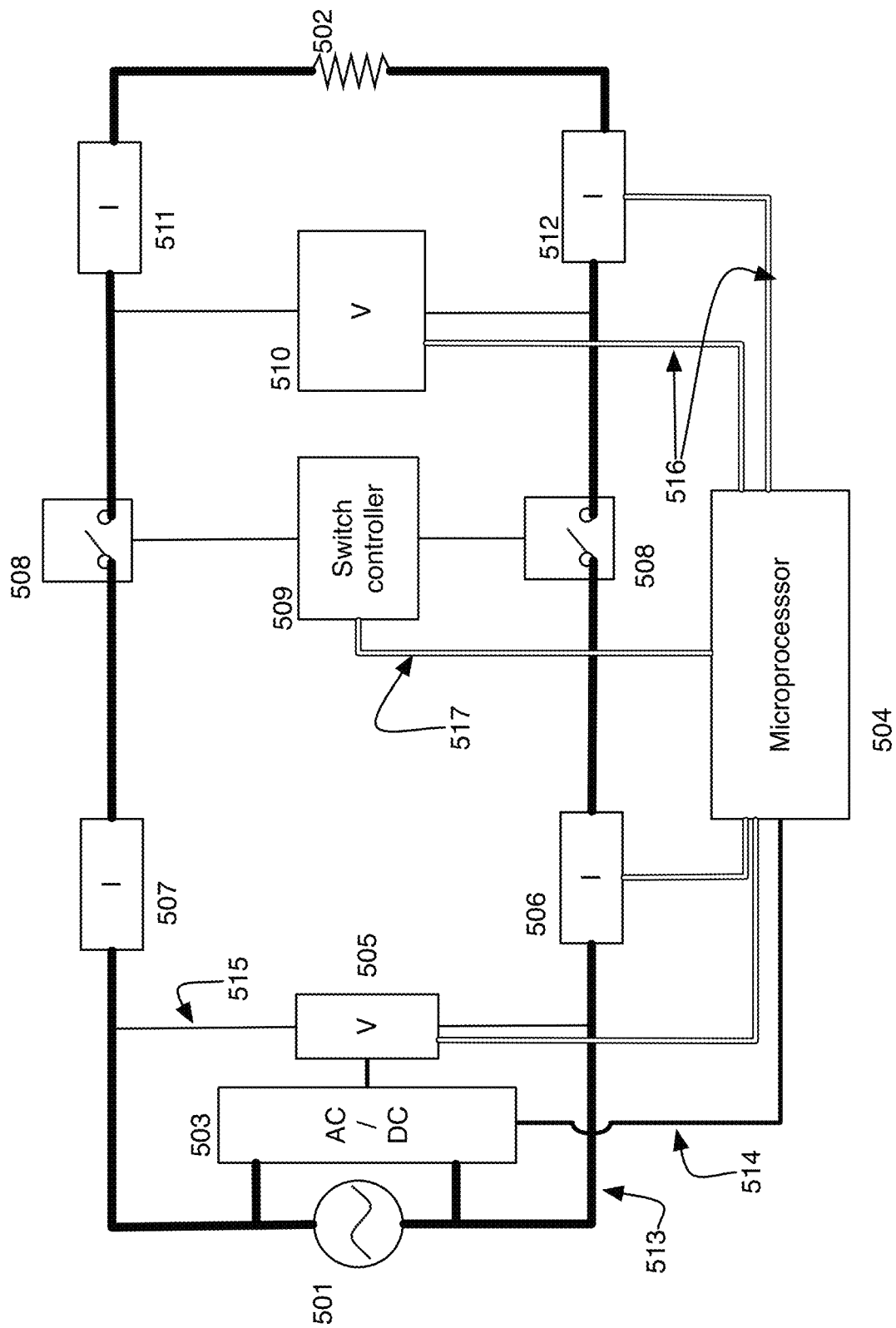
FIG. 5 is a block diagram of the electronics of the invented load identifying AC power supply.

The components in various embodiments of the load identifying AC power supply are seen in FIGS. 5-11. Referring first to FIG. 5, The AC mains 501 is connected to the load 502 through the load identifying AC power supply 503-516. The connecting lines in the Figure are shown as bold lines 513 representing power connections lighter lines 514 representing sense line connections and double lines 516 representing data acquisition 516 and control line 517 connections. A switch 508 is located in both the line and neutral arms between the source 501 and the load 502. The load identifying AC power supply includes an AC to DC converter 503 that supplies power to the current 506, 507, 511, 512 and voltage 505, 510 that acquire the AC mains data and the load data. The AC/DC converter also supplies power to a microprocessor 504. Details of the AC/DC converter in a preferred embodiment are shown and discussed in conjunction with FIGS. 6 and 7 below. The voltage and current sensors are as those known in the art and include voltage sensors using resistive dividers and current sensors including current-sensing resistor, and current amplifier, and Hall Effect sensors. The sampling results are typically processed by comparators, analog to digital converters (ADC) and stored in data storage elements that include random access memory, read only memory and other solid state memory and non-solid state memory devices as are known in the art. The Microprocessor includes components known in the art and associated with microprocessors including user interfaces to allow actuation and programming of the microprocessor, memory for storage of data and input and output ports for receiving data and sending control signals respectively. In one embodiment the input/output ports include means to access other computing devices such as handheld computing devices and remote servers. The microprocessor is programmed to effectuate the steps already described in FIG. 4. Aspects of the microprocessor may be located remote from some components of the load identifying AC power supply. As a non-limiting example data storage of a library of data may be stored remotely and accessed by wired or wireless means such as through an Internet connection. Similarly, some computation, such as a neural network analysis of the load data may be accomplished on a remote server and the results sent to the microprocessor 504. The switch 508 and switch controller 509 are controlled by the microprocessor. The details of the switch and switch controller in preferred embodiments are shown and discussed in FIGS. 8 and 9 below.

In one embodiment the AC/DC converter may be of any type known in the art that would supply a voltage and power suitable for a microprocessor, sensors and switch control. Such an AC/DC converter would include rectifier and transformer components to provide a selected voltage and power as required by sensor and microprocessor circuitry. Similarly, the switch 508 and controller 509 can be any switch/controller known in the art that can be programmably operated at frequencies required for phase angle modulation as already described. Non-limiting examples include triacs known to be used for phase angle modulation as well as solid state switches such as MOSFETs and other solid state switch devices as well as microelectromechanical (MEM) devices. In the preferred embodiment the components of the load identifying AC power supply are selected such that the entire device of FIG. 5 (Except the AC mains 501 and the load 502) can be integrated on silicon. In a preferred embodiment the AC to DC converter 503 is as described in FIGS. 6 and 7 and the Switch 508 and controller 509 are as described in FIGS. 8 and 9 below and the entire load identifying AC power supply 503-516 is integrated onto silicon. The load identifying AC power supply with control is comprised of elements 503 through 516. The load identifying AC power supply may be located anywhere in the power supply system between the AC source 501 and the load 502. In one embodiment the the AC power supply is located in an electrical supply panel. In another embodiment the AC power supply is located in an outlet box. In another embodiment is located in an extension cord. The load may be a single load device or a plurality of electrical load devices.

The AC to DC Power Supply

Figure 6:
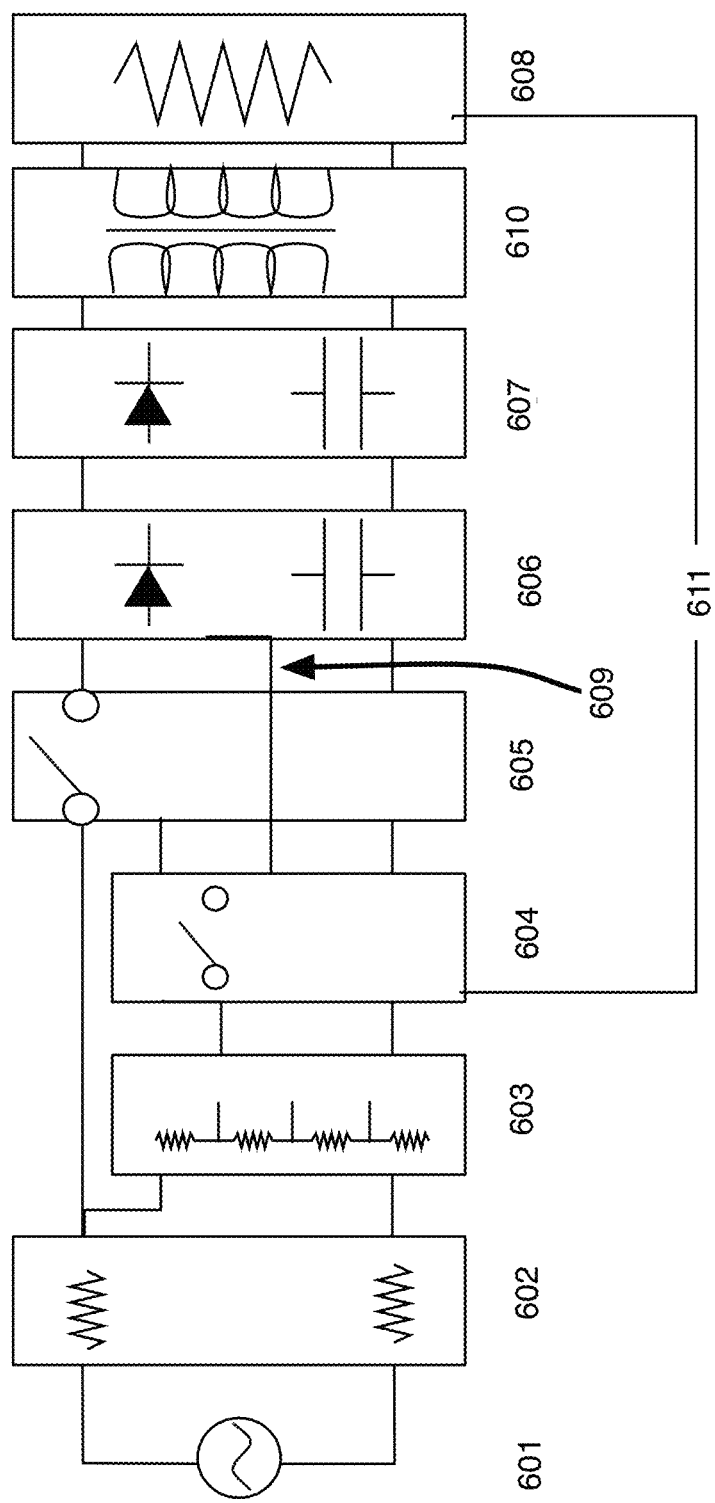
FIG. 6 is a block diagram of an AC to DC converter used in a preferred embodiment of the load identifying AC power supply.
Figure 7:
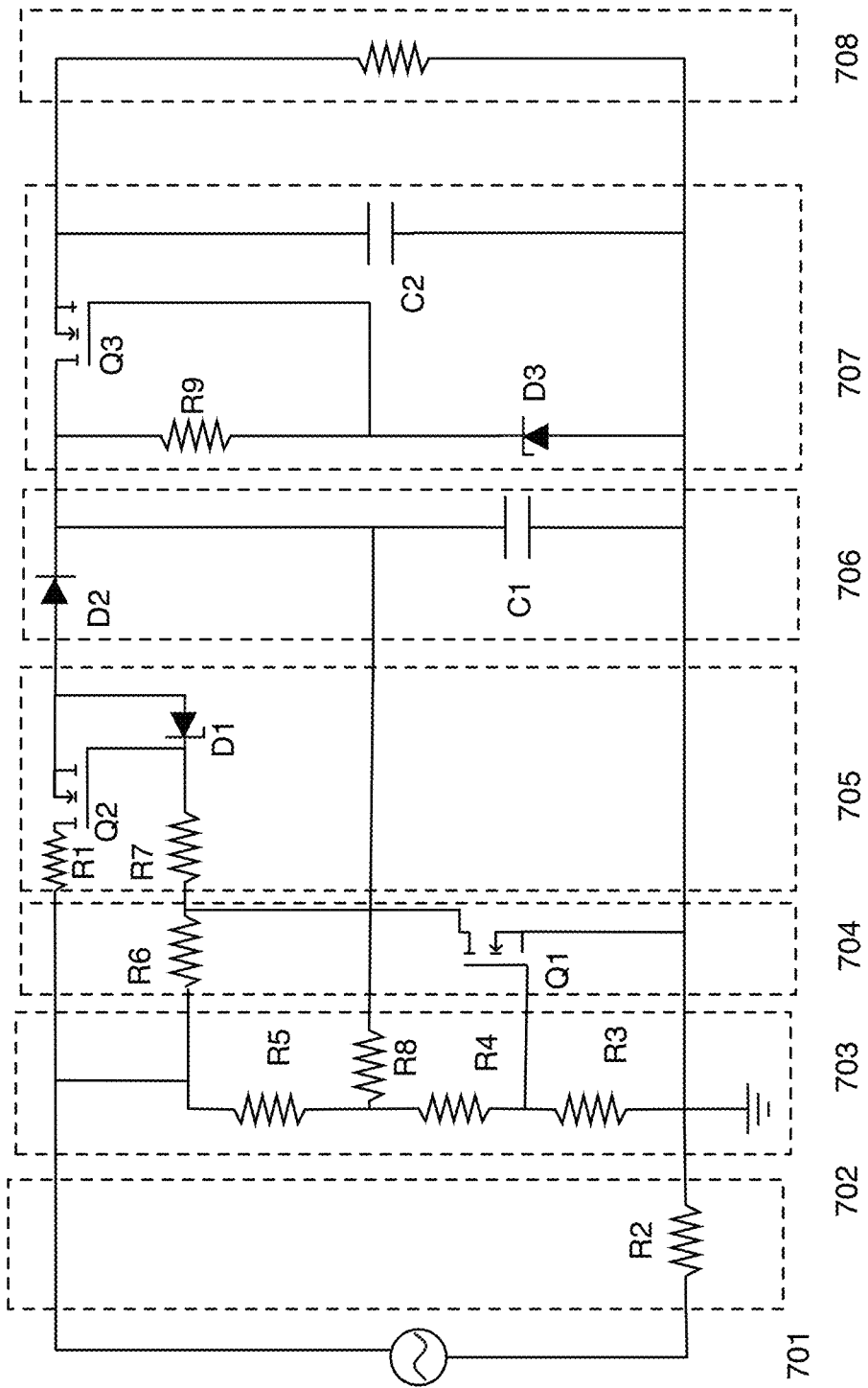
FIG. 7 is a circuit diagram of a preferred embodiment of the AC to DC converter of FIG. 6.

The details of the AC to DC converter 503 are shown in FIGS. 6 and 7. In the preferred embodiment, the AC to DC converter does not require a rectifier, is comprised, generally, of the elements shown in FIG. 6 and the method implied by these elements. A non-limiting specific example of the circuit elements is shown in FIG. 7. Referring to FIG. 6 the AC source 601 is connected to an inrush protection element 602. In one embodiment the inrush element is comprised of resistor elements in the line and neutral of the AC supply. In another embodiment, where higher power and efficiency is required the inrush protection includes switch elements that provide high resistance at startup and switch the resistor elements out of the circuit at steady state operation. After the inrush protection the AC source is sampled using a sampling element 603. In one embodiment the sampling element 603 includes resistors configured into a voltage divider network. In another embodiment the sampling element includes a reference voltage source and comparator. In another embodiment the sampling element can be manually adjusted. In another embodiment the sampling element can be automatically adjusted. The sampled voltages are used as supply to a switch driver element 604. In the preferred embodiment, the switch driver element 604 receives a feedback voltage signal 609 from the storage element 606 and based upon the voltage signal, controls the voltage applied to the gate of a switching element in the control switch and clamp element 605, thereby opening and closing the control switch 606 to supply power to the storage element 606 and ultimately the load 608. In one embodiment, where the feedback 609 is removed, the AC to DC converter is a feed forward converter where charging of the storage element 606 is controlled from the the forward side 603, 604 and 605. Addition of the the feedback control 609 provides a means for both feed forward and feedback control. In one embodiment the balance of feed forward and feedback control is determined by the selection of components in the voltage sampling element 603 and the feedback line 609. In one embodiment the balance of feedforward and feedback control is determined by resistor elements in the sampling element 603 and the feedback 609. In another embodiment variable elements are used such that the feedforward and feedback control can be adjusted. In a preferred embodiment the switch driver is comprised of a voltage divider and a switch. The switch and clamp element 605 controlled by the switch driver 604 provides pulsed power at a fixed maximum current to the storage element 606. In the preferred embodiment the switch and clamp element is comprised of an N-MOSFET and a Zener diode, connected source to gate, limits/clamps the peak voltage, and therefore peak current, to a pre-selected peak voltage value. In one embodiment the preselected limiting voltage is determined by value of the Zener voltage of the Zener diode bridging gate to source of an N-MOSFET component of the switch 605. Power from the switch and clamp element comprised of pre-selected peak current pulse is provided to a storage element 606. In one embodiment the voltage regulator is comprised of a capacitor used as an energy storage element and a diode. Charge on the capacitor is fed back through a voltage divider circuit to the switch driver 604 thereby maintaining a constant charge on the capacitor. Output from the the storage element is fed through a voltage regulator 607 to the load 608. In another embodiment the AC to DC converter further includes a galvanic isolation element 610. The galvanic isolation unit is further discussed in conjunction with FIGS. 10 and 11. In another embodiment the AC to DC converter further includes elements 611 that enable feedback from the load 608. In the preferred embodiment the feedback circuit 611 also includes galvanic isolation between the control element 604 and the load 608.

FIG. 7 shows the preferred embodiment of the AC to DC converter. Elements 701 through 708 correspond to elements 601 to 608 of FIG. 6 respectively. The AC source 701 is connected to the inrush protection circuit 701 comprised in this preferred embodiment of resistors R1 and R2. In another embodiment (not shown) the inrush protection includes switches such that the current flows through the resistors R1 and R2 at startup and bypasses the resistors once steady state operation is reached. In another embodiment the inrush control uses inductors; that is elements R1 and R2 are replaced with inductors L1 and L2. Output from the inrush protection goes to the switch Q2 of the switch and clamp circuit 705 and to the voltage sampling element 703. The voltage sampling element 703 is comprised of resistors R3, R4, R5 sampling the AC input and resistor R8 providing a feedback voltage from storage capacitor C1. The values of R3, R4, R5 and R8 are selected such that the voltage to the gate of switch Q1 in the switch driver element 704 turns switch Q1 on and off and thereby synchronously turns switch Q2 off and on thereby providing a preselected timed output pulse from switch Q2 to charge storage element C1. Resistor R8 provides a feedback path as to the charge on capacitor C1 and therefore the output voltage to the voltage sampling circuit 703 and therefore to the control circuit 704. The switch and clamp element 705 is comprised of switch Q2, Zener Diode D1 and resistor R7. The switch Q2 is controlled by the switch driver circuitry 704. The peak output current of switch Q2 is clamped to a preselected value based upon the selected values of the Zener voltage of diode D1. Pulsed output from the switch Q2 is connected to the voltage regulator 706 which through the feedback of R8 to the voltage sampling 703 and the switch driver 704 holds capacitor C1 to a constant charge. Control element switch Q1 and therefore supply switch Q2 are activated, either opened or closed, in synch with the AC input 701. The AC to DC converter provides a low voltage output with pulse modulation at the frequency of the incoming AC source. The switches are activated, either opened or closed, at voltages that are near, within the threshold values for the components Q1 and Q2, of the zero crossing of the AC source. The Output then goes to voltage regulator 707 and then load 708. The voltage regulator 707 includes switch Q3, Zener diode D3 resistor R9 and capacitor C2. Circuit components D3, Q3, R9 function as a voltage regulator. Capacitor C2 provides storage capacity to buffer and thereby smooth the output from the AC to DC converter to the load 708.

The AC to DC converter in the preferred embodiment of FIGS. 6 and 7 is comprised of elements of inrush protection 602, voltage sampling 603, a switch driver 604, a switch and clamp 605, a storage element 606 and a voltage regulator 607. Selection of components in the voltage sampling 603 determine the timing of the switch driver 604. Selection of elements in the switch and clamp determine a peak voltage and current for out pulses. Power output is controlled by selection of both the peak current and the pulse timing. Feedback from the storage element through the voltage sampling is used to select the pulse timing. The AC to DC converter operates in sync with the AC source.

The preferred embodiment of FIG. 7 include in general a voltage divider 703 connected to the power source 701, and, a first switch 704 connected through its input to the voltage divider, and, a second switch 705 whose input is connected to the output of the first switch, and, a storage capacitor C1 connected through a diode to the output of the second switch, and, a sense resistor connected 709 between the storage capacitor and the voltage divider thereby providing feedback control of the AC direct to DC extraction conversion system, and, a Zener diode D1 connected between the input and output of the second switch thereby clamping the voltage of the output and input of the second switch to the Zener voltage of the Zener diode, and, the electronic load 708 connected to the storage capacitor C1. The switches 604, 605 may be any electronically actuated switch. In one embodiment the switches are N-MOSFETs. In another embodiment the switches are bipolar transistors and in another embodiment the switches are microelectromechanical switches. In a preferred embodiment the DC power supply is fully integrated on silicon.

The Switch

Figure 8:
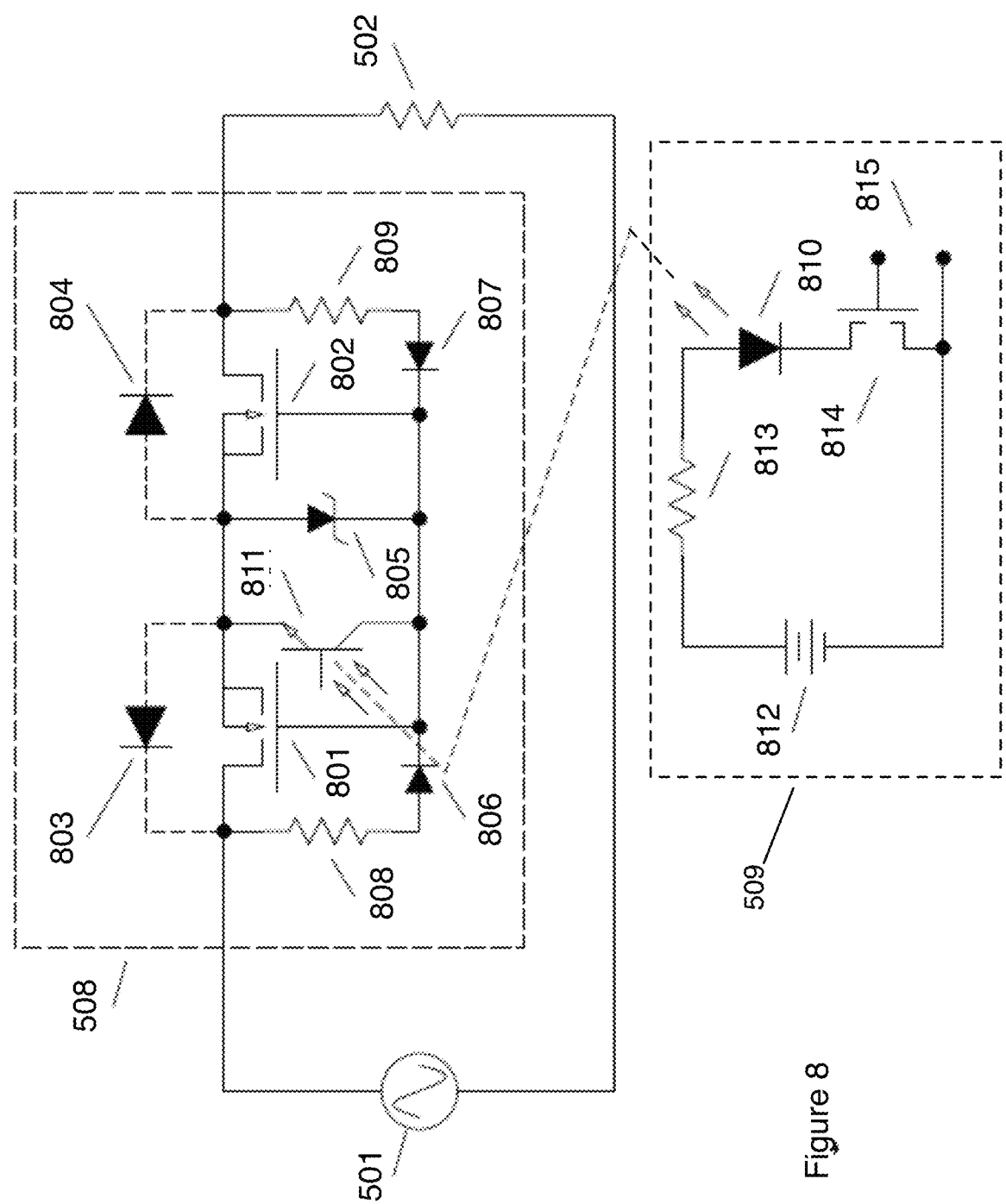
FIGS. 8 and 9 are circuit diagrams of aspects of a programmable switch used in the preferred embodiment of the load identifying AC power supply.
Figure 9:
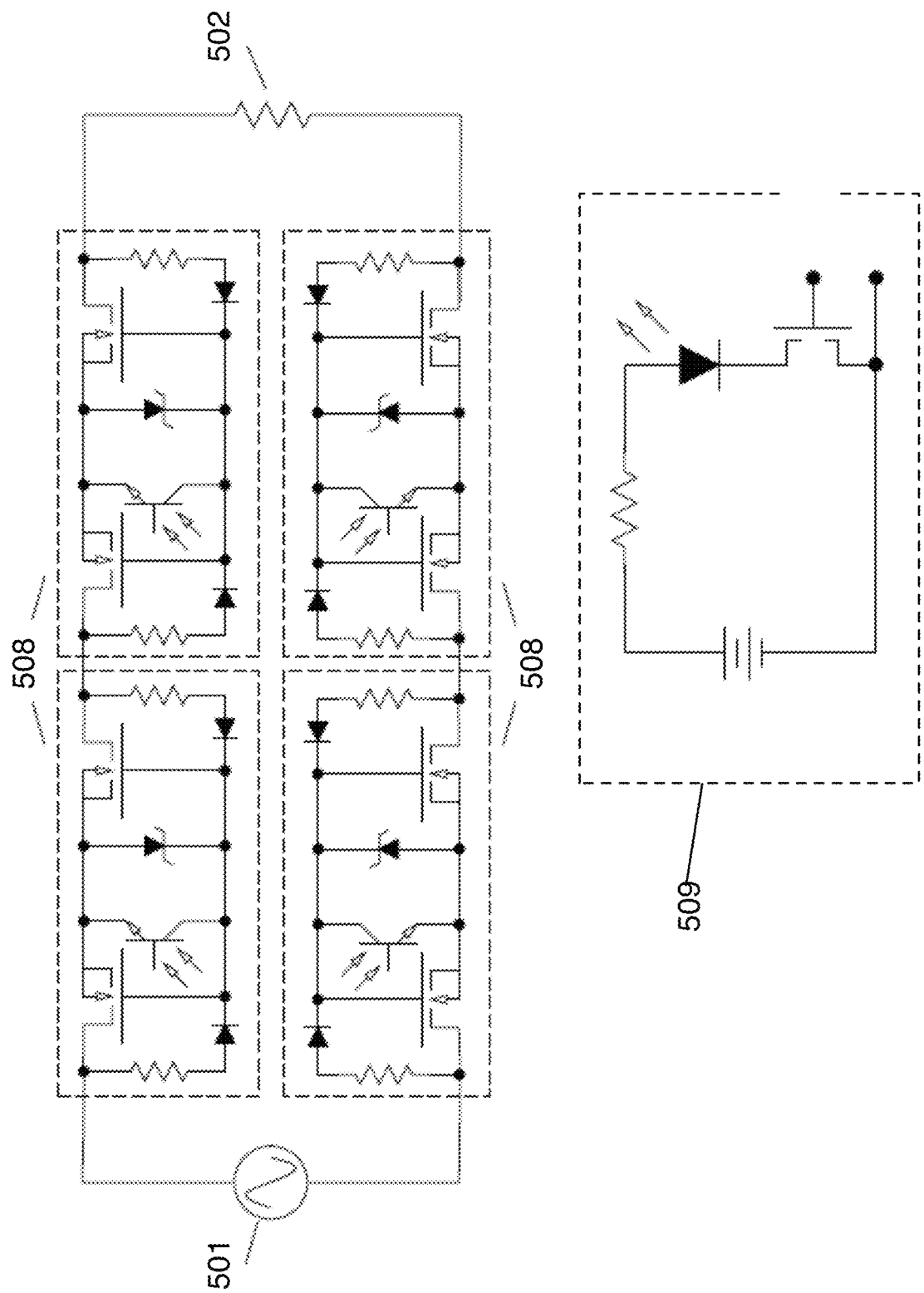

The switch 508 (FIG. 5) is integral to the invention. The power to the load 502 is varied using the switch 508 and the wave patterns of the voltage and current across and through the load are recorded before, during and after variation of the applied voltage through the switch 508. In the preferred mode the switch is controlled by the microcontroller 504 acting through controller element 509. The switch is any electronic switch that can be controlled by a microprocessor and that can be actuated at a frequency faster than the frequency of the mains power 501 and as such can be actuated in sync with the mains 501 and thereby provide phase control of the applied AC waveform, as are typically used in dimmer applications. In one embodiment the control signal is a train of pulses synchronized with the AC mains waveform and having adjustable pulse widths to effectively control the average current/power delivered to the load, thereby providing a dimming effect for a light source load and a speed control for an AC motor load. In another embodiment the control signal is a train of pulses having a fixed or variable frequency independent of the AC mains waveform thereby generating a radio-frequency (RF) power waveform at the load terminals for use as a wireless charger/generator. In another embodiment the control signal is a variable DC voltage allowing variable illumination of the LED thereby allowing the switch to operate in a linear mode. In a preferred embodiment the switch 508 and control 509 are as shown in FIGS. 8 and 9. Referring first to FIG. 8, the switch 508 controls power from AC mains 501 to load 502. The switch includes power MOSFETs 801 and 802 that include body diodes 803, 804. Zener diode 805 has a Zener voltage greater than the threshold voltage of the power MOSFETs 801, 802. Zener diode 805 is biased through rectifier diodes 806, 807 connected at the drain terminals of the power MOSFETs and protected by current limiting resistors 808, 809. Thus, in the absence of illumination resistor-diode branches 806, 808 and 807, 809 provide bias for Zener diode 805 when either of the drain terminals exceeds the Zener voltage, placing power MOSFETs 801, 802 in the "on" state. When illuminated by LED 810 phototransistor 811 shunts the bias current from branches 806, 808 and 807, 809 to the source terminals of the power MOSFETS placing them in the "off" state. LED 810 is powered by a separate low voltage source 812 and controlled by switch 814 through current limiting resistor 813. LED 810 is within optical proximity of phototransistor 811. A control line 815 connects to the processor 504 to control the phase control of switches 508 through controller 509.

The turn-on time constant is dictated by the value of the current limiting resistors 808. 809 and the gate-to-source capacitance of the power MOSFETs, while the turn-off time constant is dictated by the saturation current of the phototransistor 811 at the illumination level provided by LED 810. Both of these time constants can be designed to be much shorter than the period of the AC mains, thereby allowing this embodiment to operate in both an on-off and a phase-control mode.

FIG. 9 shows an embodiment using two switch units 508 in each arm of the AC supply to further improve the performance of the circuit. In this embodiment the power MOSFETs are selected to have one-fourth the breakdown voltage of the units used in FIG. 8. Thus, the on resistance of the individual switch units can be expected to be reduced by a factor of 32, and the total on resistance of the two switch units connected in series is reduced by a factor of 8 relative to the circuit in FIG. 8. Additionally, the voltage drop across each of the switch units in the "off" state is quartered, thereby reducing the the rate of change of the drain-to-source voltage ($dV_{ds}/dt$) experienced by each unit by a factor of four and consequently further reducing the "off" state leakage current. The inventor has found that this circuit configuration further improves the turn-off characteristics of the switch devices through reduced leakage currents.

Figure 10:
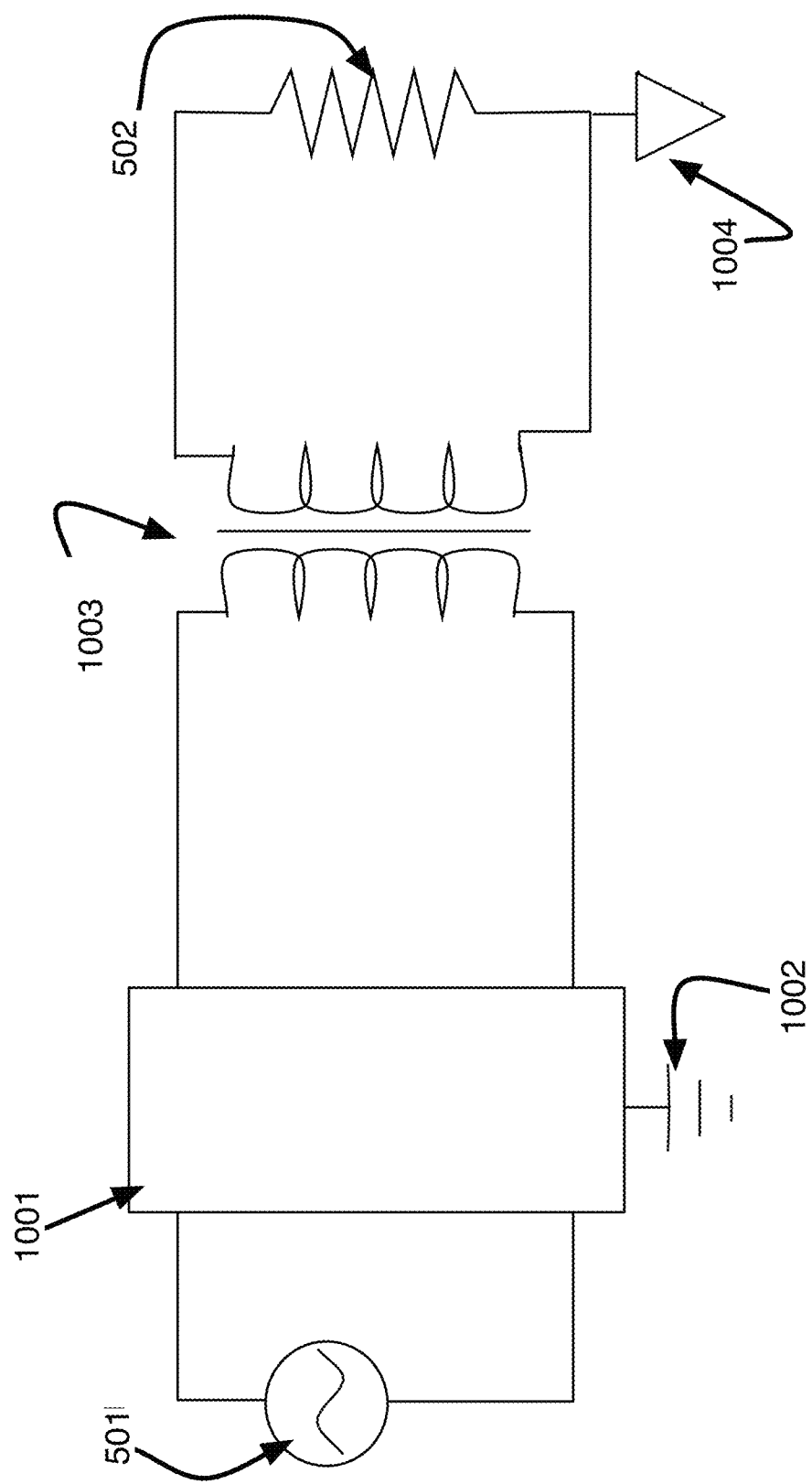
FIG. 10 is a block diagram of the load identifying AC power supply that further includes electrical isolation of the load from the AC source.

In another embodiment, shown in FIG. 10, the load 502 is galvanically isolated from the AC mains 501 and the load identifying AC power supply 1001 through use of an isolation transformer 1003. The ground 1004 of the load 502 floats relative to the ground 1002 of the AC mains 501.

Figure 11:
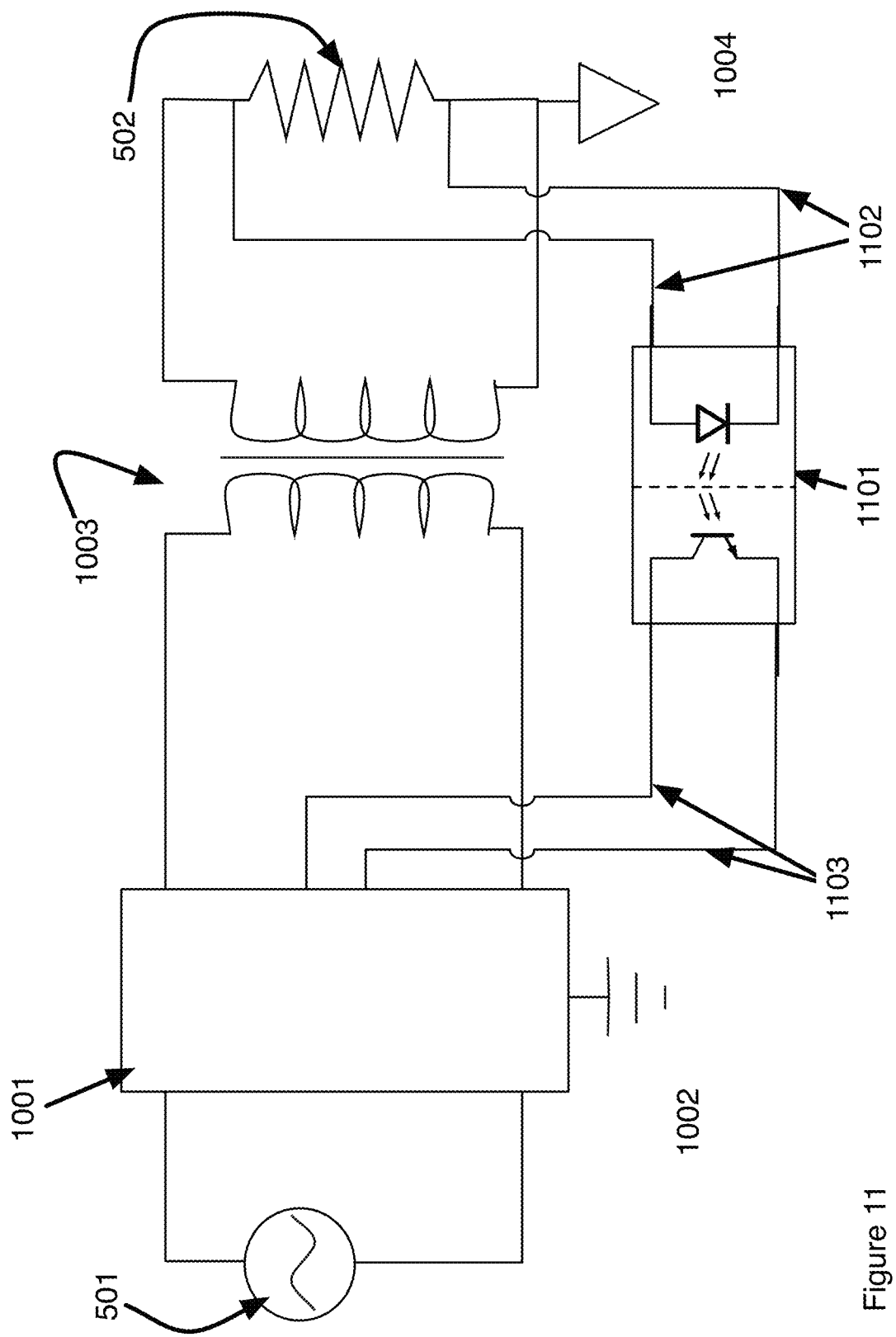
FIG. 11 is a block diagram of the load identifying AC power supply that further includes electrical isolation of the load sensors from other components of the load identifying AC power supply.

In another embodiment shown in FIG. 11, sensors attached to the load 502 are also galvanically isolated using optical coupling devices 1101. In the example shown the voltage sense lines 1102 attached to the load are electrically isolated form the sense lines 1103 that connect to the I/O ports on the microprocessor of the load identifying AC power supply 1001.

SUMMARY

An improved AC power supply is described. The supply identifies the load through monitoring the current and voltage wave forms and phase relations with the AC Mains. The comparison is done in conditions where the power to the load is programmably varied through use of a control switch located in the line and neutral between the AC mains and the load. The program of controlling the switch is varied to optimize the ability to distinguish similar load types. The switch can be further used to control power to the load that varies according to a set of rules based upon the identity of the load. In a preferred embodiment, the design enables high efficiency with minimal components that may be fully integrated onto silicon.

We claim:

1. A power supply to connect an AC supply having a periodic AC supply waveform to an electronic load and to identify the load, the power supply comprising:
   a. an AC to DC converter, and,
   b. an electronic switch inserted between the AC supply and the electronic load, and,
   c. a switch controller to control the operation of the electronic switch synchronized with and relative to the period of the AC supply waveform, and,
   d. a first voltage sensor to monitor the voltage of the AC supply, and,
   e. a second voltage sensor to monitor a voltage applied to the electronic load, and,
   f. a current sensor to monitor a current supplied to the electronic load, and,
   g. a microprocessor powered by the AC to DC converter and programmed to accept input from the first voltage sensor, the second voltage sensor and the current sensor and to control the switch controller, wherein:
      i. a first set of waveforms of the first voltage sensor, the second voltage sensor and the current sensor are acquired during a first period of time following connection of the electronic load to the power supply, and,
      ii. a second set of waveforms of the first voltage sensor, the second voltage sensor and the current sensor are acquired during a second period of time following the first period of time, and,
      iii. the voltage supplied to the load during the second period of time is interrupted by opening the electronic switch for a time shorter than one period of the AC supply waveform, and,
   h. the microprocessor is further programmed to identify the load by comparing the first set of waveforms with the second set of waveforms, wherein the comparing the first set of waveforms with the second set of waveforms includes at least one of:
      1. comparing the phase of the waveform of the second voltage sensor and phase of the waveform of the current sensor with the phase of the waveform of the first voltage sensor, and, comparing the product of the amplitude of the second voltage sensor multiplied by the amplitude of the current sensor each during the first period of time with the product of the amplitude of the second voltage sensor multiplied by the amplitude of the current sensor each during the second period of time, and,
      2. comparing a high frequency component of the waveform of the first voltage sensor with a high frequency component of the waveform of the second voltage sensor during the first period of time, and, comparing a high frequency component of the waveform of the first voltage sensor with a high frequency component of the waveform of the second voltage sensor during the second period of time, and, comparing of the high frequency components during the first and second period of time generating a pattern characteristic of the identity of the load.

2. The AC power supply of claim 1 wherein identifying the load includes identifying the load as one selected from: a pure resistive Load, a constant power resistive load, a pure reactive load, and, a constant power reactive load.

3. The AC power supply of claim 1 wherein the power to the load is controlled by the switch based upon identifying the load and a pre-selected set of rules associated with the identifying of the load.

4. The AC power supply of claim 1 wherein all components of the AC power supply are integrated onto silicon.

* * * * *